United States Patent [19]

Schaefer

[11] 4,011,520
[45] Mar. 8, 1977

[54] METHOD AND APPARATUS FOR REDUCING PHASELOCK LOOP FM'ING

[75] Inventor: Dietrich H. Schaefer, Marion, Iowa

[73] Assignee: Rockwell International Corporation, El Segundo, Calif.

[22] Filed: Aug. 11, 1975

[21] Appl. No.: 603,412

[52] U.S. Cl. .................................. 331/14; 325/421; 331/1 A; 331/16
[51] Int. Cl.² .......................................... H03B 3/04
[58] Field of Search ............... 331/1 A, 14, 16, 17; 325/419, 420, 421

[56] References Cited
UNITED STATES PATENTS

| | | |
|---|---|---|
| 3,287,657 | 11/1966 | Widl .................................. 331/17 |
| 3,328,719 | 6/1967 | Lisle et al. ........................... 331/17 |
| 3,525,945 | 8/1970 | Puente ................................ 325/419 |
| 3,805,183 | 4/1974 | Lance ................................. 331/17 |
| 3,909,735 | 9/1975 | Anderson et al. ................. 325/419 |

Primary Examiner—John Kominski
Attorney, Agent, or Firm—Terry M. Blackwood; Robert J. Crawford

[57] ABSTRACT

Method and apparatus for reducing phaselock loop FM'ing without disturbing the loop filter. After the loop is locked, the loop filter input signal is changed so that high frequency components therein are increased in intensity and yet the average value of this signal is substantially unchanged.

8 Claims, 5 Drawing Figures

METHOD AND APPARATUS FOR REDUCING PHASELOCK LOOP FM'ING

The invention herein described was made in the course of/or under a contract or subcontract thereunder with The Department of the Air Force.

The present invention relates generally to electronic phaselock circuitry and more specifically to reduction of loop FM'ing.

The degree of frequency modulation of the voltage controlled oscillator in a phaselock loop is a function of the loop bandwidth requirements and the type of loop filtering employed. For phaselock loops with nominal bandwidths or fast acquisition time requirements, this FM'ing effect can be quite severe. The addition of low pass filtering to the loop filter will help to alleviate this situation. However, many times such filters will affect the loop dynamics in an adverse manner.

In accordance with the present invention, phaselock circuitry features reduction of loop FM'ing without disturbing the loop filter. This and other features, objects, and advantages of the invention will become more apparent upon reference to the following specification, claims, and appended drawings in which:

Figure 1:
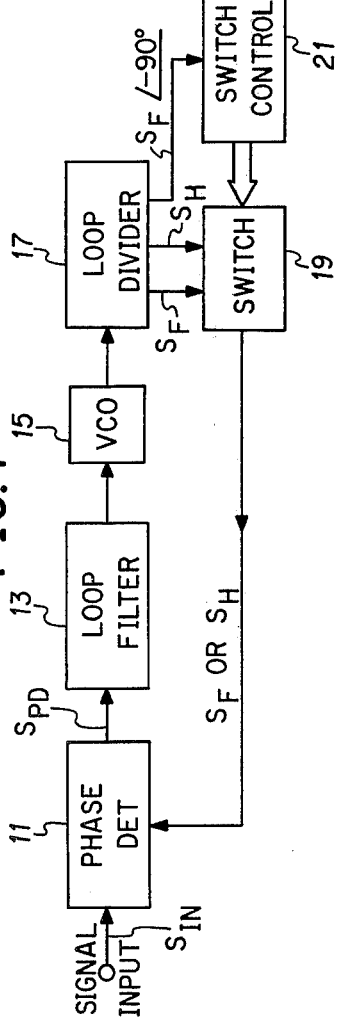
FIG. 1 is a block diagram schematic of the presently preferred embodiment of this invention.

In the presently preferred embodiment, illustrated in FIG. 1, phase detector 11, in response to an input signal, $S_{IN}$, and a feedback signal, $S_F$ or $S_H$, provides to loop filter 13 signal $S_{PD}$ whose average value depends on, and is indicative of, the phase relationship between $S_{IN}$ and the feedback signal. Filter 13 in turn provides a DC signal which controls the voltage controlled oscillator (VCO) 15 output frequency. A loop divider 17 receives the VCO output and provides, to switch 19, signals $S_F$ and $S_H$, and to switch control circuit 21, signal $S_F \angle -90°$. $S_H$ is synchronous with $S_F$ and the frequency $f_H$ of $S_H$ is an odd multiple of the frequency $f_F$ of $S_F$. The frequency $f_F$ is nominally the same as the frequency $f_{IN}$ of $S_{IN}$, and $S_F \angle -90°$ is $S_F$ phase shifted by a constant $-90°$. $S_L$, which is either high (i.e., a logic one) or low (i.e., a logic zero) and indicates loop lock or no-lock respectively, and $S_F \angle -90°$ are fed to switch control circuit 21 wherein an appropriate switch command is generated causing switch 19 to select either $S_F$ or $S_H$ as the feedback signal to phase detector 11. Signal $S_{IN}$ is preferably a square wave (i.e., a periodic wave which alternately assumes, for half-period intervals, one of two fixed values) but as will later be seen, other $S_{IN}$ wave shapes may be employed. Also, it should here be noted that the term "average" will be used herein in the sense that the average value of a periodic and continuous function is directly proportional to the integral of that function over one period of that function.

Figure 2:
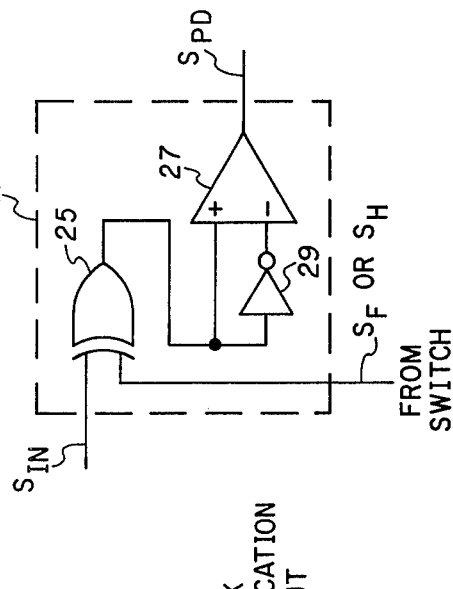
FIG. 2 is a more detailed schematic of the phase detector portion of the FIG. 1 circuitry.

Turning now to FIG. 2, it is seen that the phase detector comprises an exclusive-OR gate 25 combined with differential amplifier 27 and inverter 29 so as to provide a bipolar output signal. Operation of phase detector 11 is set forth in the truth table below:

| TRUTH TABLE FOR FIGURE 2 | | |
|---|---|---|
| $S_{IN}$ | $S_F$ or $S_H$ | $S_{PD}$ |
| 0 | 0 | −K |
| 0 | 1 | +K |
| 1 | 0 | +K |
| 1 | 1 | −K |

Filter 13 is a loop filter tailored to the particular filtering requirements of the phase detector output signal. The filter not only sets the bandwidth of the phaselock loop but also provides filtering of the phase detector output signal adequate to prevent any one signal from reaching the VCO input. In the preferred embodiment, the loop filter contains an integrator to provide large amounts of DC gain, a high pass section to provide proper loop damping, and two low pass sections with their corner frequency appropriately removed (a minimum factor of four) from the corner frequency of the high pass section to minimize their effect on loop dynamics. VCO 15 may be variously embodied and preferably comprises a voltage controlled astable multivibrator whose center frequency for a zero volt input level is nominally an integral multiple of the frequency $f_{IN}$ of $S_{IN}$, and whose frequency is variable both above and below this nominal or center frequency.

Figure 3:
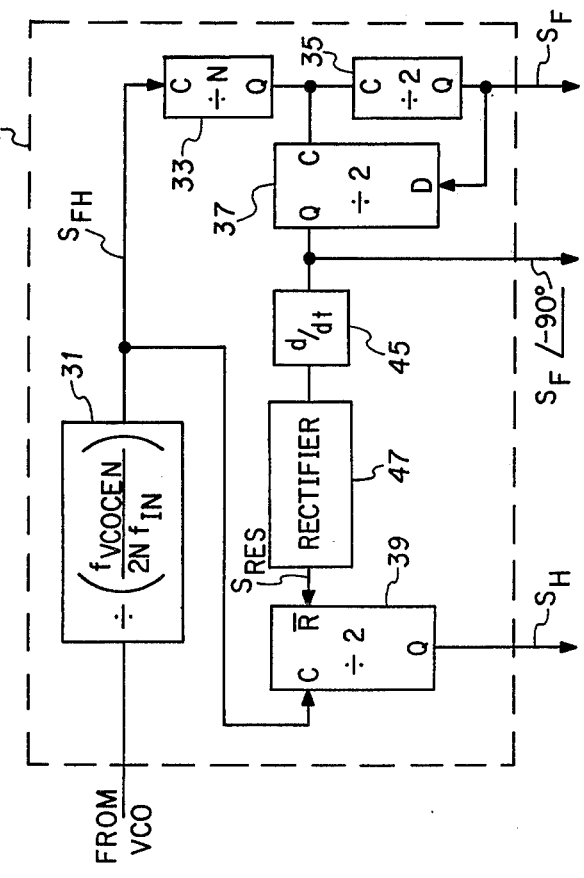
FIG. 3 is a more detailed schematic of the loop divider portion of the FIG. 1 circuitry.

Loop divider 17, shown in more detail in FIG. 3, comprises an arrangement of digital dividers appropriate to produce, in response to the VCO output, signals $S_F$, $S_H$, and $S_F \angle -90°$. More particularly, divider 31 comprises a series of appropriately coupled flip-flops and produces in response to the VCO output, the signal $S_{FH}$ whose frequency is $2N \times f_F$ where N is an odd number $>1$. Divider 33 comprises a series of negative edge triggered flip-flops appropriately coupled to provide division by N. The output of divider 33, for the FIG. 3 embodiment, is a waveform having a 50% duty cycle. Dividers 35 and 39 are each a negative edge triggered flip-flop which provide division by 2. Divider 37, a positive edge triggered D type flip-flop provides the desired 90° phase relationship between $S_F$ and $S_F \angle -90°$. Differentiator 45 and rectifier 47 ensure that $S_H$ is low during the occurrence of a negative edge of $S_F \angle -90°$. In conjunction with the waveforms at the top of FIG. 5, which assume that N equals three, the operation of the FIG. 3 apparatus is deemed self-explanatory.

Figure 4:
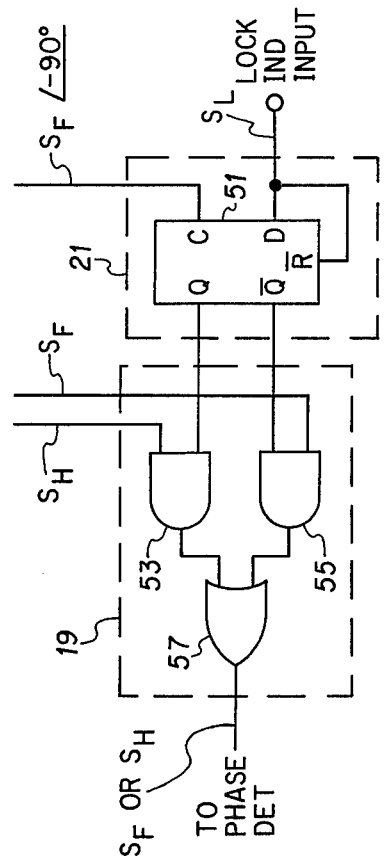
FIG. 4 is a more detailed schematic of the switch and switch control portions of the FIG. 1 circuitry.

As seen in more detail in FIG. 4, switch control circuit 21 comprises a negative edge triggered delay flip-flop 51 whose clock input C is tied to $S_F \angle -90°$ and whose D and $\overline{R}$ inputs are tied to the LOCK INDICATION INPUT. As connected, the Q output of flip-flop 51 is always low so long as $S_L$ is low. When $S_L$ goes high, Q will also go high at the next occurrence of a negative edge of $S_F \angle -90°$. Switch 19 comprises two AND gates 53 and 55 and an OR gate 57. When the Q output of flip-flop 51 is low (and thus, $\overline{Q}$ is high), the switch output is $S_F$. When the Q output is high (and thus $\overline{Q}$ is low), the switch 19 output is $S_H$.

To aid in describing the operation of the FIG. 1 apparatus, reference will now be made to Examples 1, 2, and 3 of FIG. 5 wherein it is assumed that $N=3$. Each example shows the phase detector output $S_{PD}$ for a particular phase relation between $S_{IN}$ and the feedback signal. (Although for convenience in illustration, $S_{IN}$ is shown as shifting in phase from example to example while $S_F$ and $S_H$ remain constant, it will be apparent to those skilled in the art that in practice $S_{IN}$ is actually relatively constant in phase and $S_F$ and $S_H$ shift in phase relative to $S_{IN}$.) More particularly, Examples 1, 2, and 3 assume that the loop is tracking $S_{IN}$ with phase error of 0°, −15°, and +15° respectively. Each example assumes that initially an out-of-lock condition is indicated, i.e., $S_L$ initially low. It should also be pointed out that, in practice, resetting of divider 39 by $S_{RES}$ (so that $S_H$ is properly phased relative to $S_F$) occurs much earlier than illustrated and typically just after the system is turned on. Also, in practice, only one reset pulse is necessary to properly phase $S_H$ with $S_F$ but the resetting scheme illustrated, where $S_{RES}$ is periodic is particularly convenient.

Examining Examples 1, 2, and 3 in conjunction with FIGS. 2 and 4, it is seen that the feedback signal is initially $S_F$, and at the negative edge of $S_F \angle{-90°}$ simultaneous with or first following $S_L$ going high, a switchover occurs such that the feedback signal becomes $S_H$. For the 0° tracking error example (i.e., Example 1) it is seen that $S_{PD}$ has a zero average value for the time subsequent to the switchover time $t_S$ and also contans more high frequency components than prior to $t_S$. Had no switchover to $S_H$ occurred (i.e., has $S_F$ continued as the feedback signal), $S_{PD}$ would also have had a zero average value for time subsequent to $t_S$. This may be seen by evaluating the integral of $S_{PD}$ over the 360° interval preceding $t_S$. Since the loop is no longer closing toward 0° tracking error, $S_F$ would remain substantially unchanged after $t_S$, and thus $S_{PD}$ would be substantially identical for the 360° intervals before and after $t_S$. For Examples 2 and 3, $S_{PD}$ has, for the time subsequent to $t_S$, an average value of −K/6 and +K/6 respectively. Had no switchover to $S_H$ occurred, $S_{PD}$ of Examples 2 and 3 would have had, for time subsequent to $t_S$, substantially the same average values of −K/6 and +K/6 respectively. It is significant that following the switchover to $S_H$, $S_{PD}$ in each example contains more high frequency components and yet the average value of $S_{PD}$ is substantially unchanged from what it would have been had $S_F$ continued as the feedback signal. Stated another way, switching from $S_F$ to $S_H$ causes the spectral energy distribution of $S_{PD}$ to become more heavily weighted at higher frequencies without substantially changing the average value of $S_{PD}$. Of course, with more high frequency components present in $S_{PD}$, the loop filter effectiveness is improved.

It should be apparent from FIG. 4 that when $S_L$ returns to a logic zero, flip-flop 51 is immediately reset and switch 19 is toggled so that the feedback signal again becomes $S_F$.

Some additional observations should be made regarding the preferred embodiment. Firstly, it has been found highly preferable to synchronize $S_H$ and $S_F$ as shown in FIG. 5 such that the positive edge of $S_F$ coincides in time with a negative edge of $S_H$, which of course also means for N= any odd number, the negative edge of $S_F$ coincides with a positive edge of $S_H$. If this relationship is not maintained, the average value of $S_{PD}$ after switchover is somewhat different from what the average value would have been had no switchover occurred and the transients thus generated may overly disturb the loop. More particularly, if $S_H$ were positioned 15° to the left of the position illustrated in FIG. 5 and $S_F$ were maintained in the position shown in FIG. 5, after the switchover in Example 1, the average value of $S_{PD}$ for the first 360° following switchover would be +K/6 whereas had there been no switchover to $S_H$, the average value of $S_{PD}$ would have remained zero. After the switchover to this hypothetical signal $S_H \angle{15°}$, assuming the transients did not throw the VCO too far off, the loop would try to track $S_{IN}$ such that $S_{PD}$ returned to a zero average value. However, when $S_{PD}$ averaged zero, $S_F$ would be positioned 75° relative to $S_{IN}$ instead of at the desired 90° relative to $S_{IN}$. Thus, depending on the scheme used to generate the lock indication signal $S_L$, and whether or not $S_F$ were used to generate $S_L$, an out-of-lock condition might be indicated by the time the average value of $S_{PD}$ arrived at zero.

Secondly, it has been found preferable to switch from $S_F$ to $S_H$ at or near the time a zero crossing of $S_{IN}$ occurs. This condition, illustrated in each example of FIG. 5, is accomplished by using a negative edge of $S_F \angle{-90°}$ as the time of switchover. With switchover occurring at or near a zero crossing of $S_{IN}$, loop disturbance is minimized.

Figure 5:
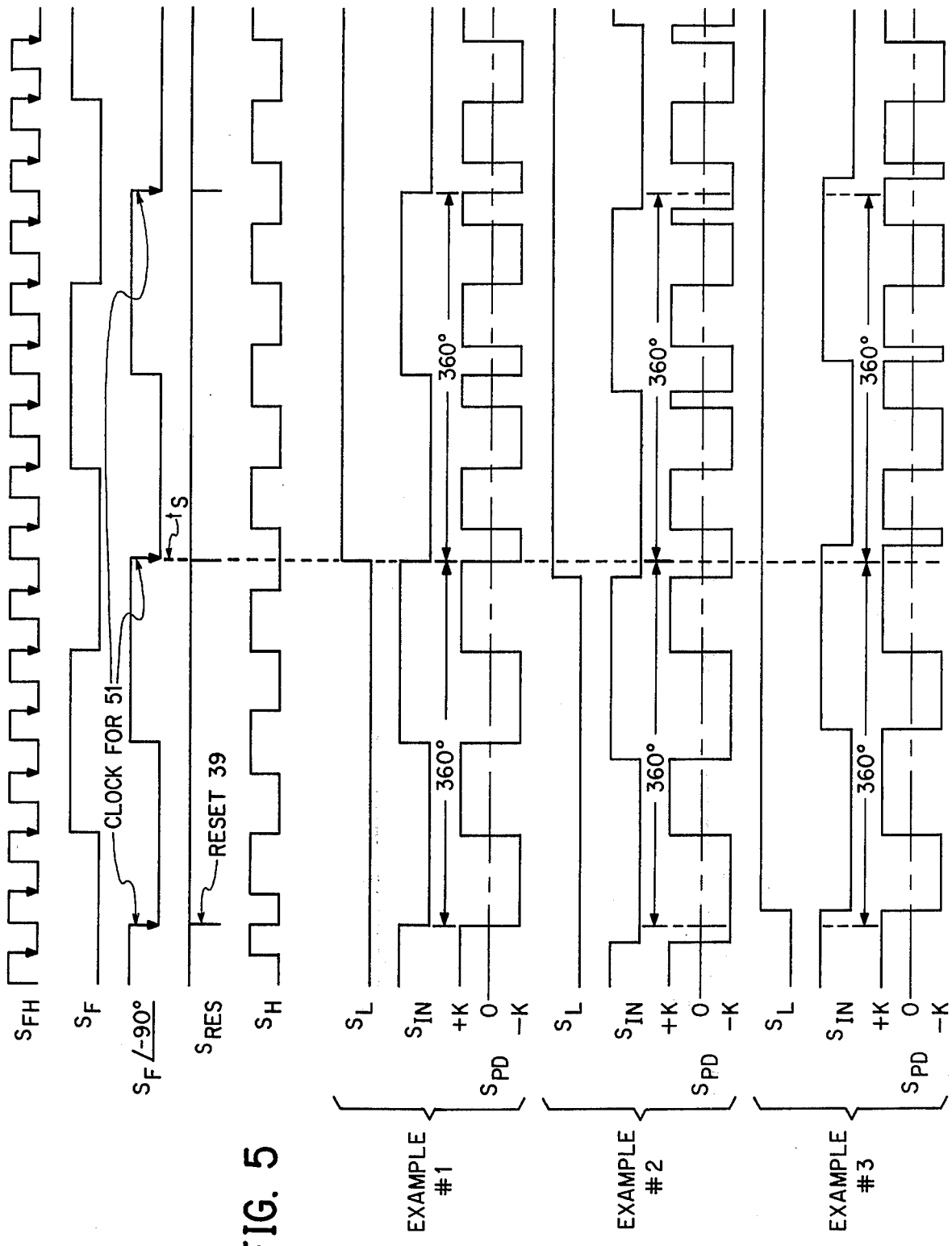
FIG. 5 shows waveforms useful in explaining the operation of the FIG. 1 embodiment.

Thirdly, it will be noted from each example of FIG. 5 that $S_L$ goes high at a zero crossing of $S_{IN}$. This is a characteristic of the method and apparatus actually used to generate $S_L$ for the FIG. 1 apparatus. Such method and apparatus are described in my patent application Ser. No. 600,539 filed 7/31/75, entitled "Phaselock Circuitry with Lock Indication" and assigned to the assignee of the present invention. However, other techniques for generating a lock indication signal may be employed with the present invention. For instance, the auxiliary or quadrature phase detector method with an appropriate threshold detector would provide an appropriate lock indication signal. (See Page 52 of F. M. Gardner's book entitled "Phaselock Techniques"; Wiley and Son; 1966.) Moreover, the time location of the transition of $S_L$ from low to high is not significant since the exact time of switchover is controlled by $S_F \angle{-90°}$.

It should be apparent that the inventive principles herein are not limited to the above-described embodiment. For instance, values of N other than N=3 may be employed. In a present successful application of the inventive principles herein (i.e., in bearing instrumentation in a TACAN system $S_F$, $S_H$ and N are respectively 15 HZ, 135 HZ and 9.

Also, in some applications, it may be desirable, in order to provide additional loop settling time, to increase the delay between the time of $S_L$'s low to high transition and the time of switchover. This may be accomplished by adding a delay circuit between the D input of flip-flop 51 and the LOCK INDICATION INPUT. Several alternatives, including one-shots and counters, are available to implement such additional delay.

Also, as earlier mentioned, other $S_{IN}$ wave shapes may be used in practicing the present invention. For instance, if $S_{IN}$ were a train of narrow pulses, one could employ a type of phase detector particuarly suited to such inputs. Such a phase detector is described in my patent application Ser. No. 591,542, filed 6/30/75, entitled "Electronic Phaselock Circuitry" and assigned to the assignee of this invention. As a further example, if $S_{IN}$ were sinusoidal, one way to successfully apply the present invention thereto would be merely to limit the sinusoid and produce a square wave.

Too, it should be pointed out that the placement of switch 19 between the loop divider 17 and the phase detector 11, although preferred, is not necessary. By using two phase detectors and feeding $S_F$ to one and $S_H$ to the other, and then switching the loop filter input to the appropriate phase detector output in accordance with the principles hereinabove described, results identical to those for the preferred embodiment of FIG. 1 may be achieved.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. Phaselock circuitry having a substantially fixed frequency input signal $S_{IN}$ to be tracked and an input signal $S_L$ indicating whether the loop is locked, said phaselock circuitry comprising:
    first means comprising a loop filter whose filtering characteristic is fixed;
    second means, including controllable oscillator means, for providing two variable frequency signals $S_F$ and $S_H$ where the frequency of $S_F$ is nominally the same as that of $S_{IN}$, and the frequency of $S_H$ is an odd multiple N of the frequency of $S_F$ and thus is nominally an odd multiple N of the substantially fixed frequency of $S_{IN}$; and
    third means, including phase detection means connected for continuously receiving said signal $S_{IN}$ and switching means, said third means also connected for receiving $S_F$, $S_H$, and $S_L$, and providing, in accordance with the loop condition as indicated by $S_L$, to the loop filter input one of two signals $S_X$ or $S_Y$, where $S_X$ is a phase detection means output signal produced by the phase comparison in said phase detection means of said signals $S_{IN}$ and $S_F$, and $S_Y$ is a phase detection means output signal produced by the phase comparison in said phase detection means of said signals $S_{IN}$ and $S_H$, said signal $S_X$ being provided to said loop filter input after $S_L$ indicates no-lock and said signal $S_Y$ being provided to said loop filter input after $S_L$ indicates lock.

2. Circuitry as defined in claim 1 wherein $S_F$ and $S_H$ are synchronous and the phase relationship between $S_F$ and $S_H$ is such that each of the zero crossings of $S_F$ coincide with a zero crossing of $S_H$.

3. Circuitry as defined in claim 2 wherein $S_Y$ is provided to said loop filter input at or near a predetermined point in a cycle of $S_{IN}$.

4. Apparatus as defined in claim 3 wherein said predetermined point is a zero crossing of $S_{IN}$.

5. A method of operating a phaselock loop containing phase detection means, a loop filter whose filtering characteristic is fixed, and controllable oscillator means, said method reducing the degree of frequency modulation of said oscillator without disturbing said loop filter, said method comprising:
    providing continuously to said phase detection means an input signal $S_{IN}$ which is to be tracked, $S_{IN}$ being of substantially fixed frequency $f_{IN}$;
    providing an input signal $S_L$ which indicates whether the loop is locked;
    generating a variable frequency signal $S_F$ whose frequency $f_F$ is nominally the same as $f_{IN}$ and where $f_F$ is dependent on the phase between $S_{IN}$ and $S_F$;
    generating a variable frequency signal $S_H$ having frequency $f_H$ which is an odd multiple N of $f_F$ and thus is nominally an odd multiple N of said $f_{IN}$; and
    providing, in accordance with the loop condition as indicated by $S_L$, one of two signals $S_X$ or $S_Y$ to the input of said filter, $S_X$ being a phase detection means output signal produced by the phase comparison in said phase detection means of said signals $S_{IN}$ and $S_F$, and $S_Y$ being a phase detection means output signal produced by the phase comparison in said phase detection means of said signals $S_{IN}$ and $S_H$,
    said signal $S_X$ being used as the input to said loop filter while the loop is locking, said signal $S_Y$ being used as the input to said loop filter after lock is indicated by $S_L$.

6. The method as defined in claim 5 wherein $S_F$ and $S_H$ are synchronous and the phase relationship between $S_F$ and $S_H$ is such that each of the zero crossings of $S_F$ coincide with a zero crossing of $S_H$.

7. The method as defined in claim 6 wherein $S_Y$ is provided to said loop filter input at or near a predetermined point in a cycle of $S_{IN}$.

8. The method as defined in claim 7 wherein said predetermined point is a zero crossing of $S_{IN}$.

* * * * *